United States Patent
Wang (10) Patent No.: US 9,905,762 B2
(45) Date of Patent: Feb. 27, 2018

(54) DISPLAY SUBSTRATE AND FABRICATING METHOD THEREOF, AND SYSTEM FOR FABRICATING DISPLAY SUBSTRATE AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Zhen Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/511,309

(22) PCT Filed: Apr. 1, 2016

(86) PCT No.: PCT/CN2016/078316
§ 371 (c)(1),
(2) Date: Mar. 15, 2017

(87) PCT Pub. No.: WO2016/206435
PCT Pub. Date: Dec. 29, 2016

(65) Prior Publication Data
US 2017/0288142 A1    Oct. 5, 2017

(30) Foreign Application Priority Data

Jun. 23, 2015 (CN) .......................... 2015 1 0350381

(51) Int. Cl.
*H01L 27/32* (2006.01)
*H01L 51/00* (2006.01)
(Continued)

(52) U.S. Cl.
CPC ............ *H01L 51/0011* (2013.01); *G03F 1/50* (2013.01); *G09G 3/2003* (2013.01);
(Continued)

(58) Field of Classification Search
CPC ............... H01L 27/156; H01L 27/3213; H01L 27/3218; H01L 51/0011; H01L 51/0097;
(Continued)

(56) References Cited

U.S. PATENT DOCUMENTS

| | | | |
|---|---|---|---|
| 2010/0026173 A1 | 2/2010 | Lhee et al. | |
| 2011/0242149 A1* | 10/2011 | Yoshida | G09G 3/3648 345/690 |
| 2013/0050864 A1 | 2/2013 | Lin | |

FOREIGN PATENT DOCUMENTS

| | | |
|---|---|---|
| CN | 104617129 | 5/2015 |
| CN | 104898369 A | 9/2015 |
| KR | 2012052716 A | 5/2012 |

OTHER PUBLICATIONS

English Translation of PCT International Search Report and Written opinion, Application No. PCT/CN2016/078316, dated Jul. 1, 2016, 9 pps.

* cited by examiner

*Primary Examiner* — Stephen W Smoot
(74) *Attorney, Agent, or Firm* — Armstrong Teasdale LLP (57) ABSTRACT

A display substrate and a fabricating method thereof, and a system for fabricating a display substrate and a display device are disclosed. The display substrate includes a plurality of pixels, each of which includes a first sub-pixel, a second sub-pixel, a third sub-pixel and a fourth sub-pixel arranged in a first direction. The fourth sub-pixel in a first pixel is adjacent to the first sub-pixel in a second pixel, and that the second pixel is adjacent to the first pixel and at a side of the first pixel in the first direction. The fourth sub-pixel in (Continued)

the first pixel is adjacent to the second sub-pixel in a third pixel, and the third pixel is adjacent to the first pixel and at a side of the first pixel in a second direction perpendicular to the first direction.

16 Claims, 8 Drawing Sheets

(51) Int. Cl.
- *G03F 1/50* (2012.01)
- *G09G 3/3208* (2016.01)
- *G09G 3/20* (2006.01)
- *H01L 51/56* (2006.01)

(52) U.S. Cl.
CPC ......... *G09G 3/2074* (2013.01); *G09G 3/3208* (2013.01); *H01L 27/3213* (2013.01); *H01L 27/3218* (2013.01); *H01L 51/56* (2013.01); *G09G 2300/0452* (2013.01); *G09G 2320/0233* (2013.01)

(58) Field of Classification Search
CPC ......... H01L 51/56; G03F 1/50; G09G 3/3208; G09G 2300/0452
See application file for complete search history.

DISPLAY SUBSTRATE AND FABRICATING METHOD THEREOF, AND SYSTEM FOR FABRICATING DISPLAY SUBSTRATE AND DISPLAY DEVICE

CROSS REFERENCE TO RELATED APPLICATIONS

This application is a National Stage Entry of PCT/CN2016/078316 filed Apr. 1, 2016, which claims the benefit and priority of Chinese Patent Application No. 201510350381.0 filed on Jun. 23, 2015, the disclosures of which are incorporated by reference herein in their entirety as a part of the present application.

BACKGROUND

Exemplary embodiments of the present disclosure relate to a display substrate and a fabricating method thereof, a system for fabricating a display substrate, and a display device.

The primary method to form sub-pixels by a fine metal mask (FMM) is evaporating the materials for the sub-pixels (for example, organic light-emitting materials for forming sub-pixels in an OLED) on a low temperature poly-silicon (LTPS) backplate by way of evaporation according to predetermined procedures, and forming red sub-pixels, green sub-pixels and blue sub-pixels by geometrical openings on the FMM.

Since the FMM requires a relatively high precision and the openings for forming sub-pixels are relatively small, the openings are prone to be deformed due to an external force or a magnetic field, which may cause the sub-pixels formed by the openings to be deformed accordingly. Therefore, manufacturing yield of the FMM is not high, and it is difficult to reach a higher resolution.

BRIEF DESCRIPTION

Embodiments of the present disclosure provide a display substrate and a fabricating method thereof, a system for fabricating a display substrate, and a display device, which can improve precision of sub-pixels formed by mask plates.

A first aspect of the present disclosure provides a method for fabricating a display substrate, which includes forming a first circuit for driving a first sub-pixel, a second circuit for driving a second sub-pixel, a third circuit for driving a third sub-pixel and a fourth circuit for driving a fourth sub-pixel, forming the first sub-pixel on the first circuit and the fourth circuit by a first mask plate, the first mask plate includes a plurality of first openings, each of which corresponds to one first sub-pixel and one fourth sub-pixel, forming the second sub-pixel on the second circuit and the fourth circuit by a second mask plate, the second mask plate includes a plurality of second openings, each of which corresponds to one second sub-pixel and one fourth sub-pixel, forming the third sub-pixel on the third circuit and the fourth circuit by a third mask plate, the third mask plate includes a plurality of third openings, each of which corresponds to one third sub-pixel and one fourth sub-pixel. The first sub-pixel, the second sub-pixel and the third sub-pixel on the fourth circuit are superposed to form the fourth sub-pixel.

According to an embodiment of the present disclosure, each pixel in the display substrate to be formed includes the first sub-pixel, the second sub-pixel, the third sub-pixel and the fourth sub-pixel arranged in a first direction. The fourth sub-pixel corresponding to the first opening belongs to a first pixel, the first sub-pixel corresponding to the first opening belongs to a second pixel adjacent to the first pixel and at a side of the first pixel in the first direction. The fourth sub-pixel corresponding to the second opening belongs to the first pixel, the second sub-pixel corresponding to the second opening belongs to a third pixel adjacent to the first pixel and at a side of the first pixel in a second direction perpendicular to the first direction. The third sub-pixel and the fourth sub-pixel corresponding to the third opening belong to the first pixel.

According to an embodiment of the present disclosure, the plurality of second openings are arranged in the second direction, the fourth sub-pixel corresponding to a first second opening of two adjacent second openings is arranged at a side of the second sub-pixel corresponding to the first second opening in the second direction, and the fourth sub-pixel corresponding to a second second opening of the two adjacent second openings is arranged at another side of the second sub-pixel corresponding to the first second opening in the second direction.

According to an embodiment of the present disclosure, the first sub-pixel, the second sub-pixel, the third sub-pixel and the fourth sub-pixel are in a rectangular shape, and the first opening, the second opening and the third opening are in a rectangular shape.

According to an embodiment of the present disclosure, the adjacent sub-pixels in the first pixel are spaced apart by a preset distance. The first sub-pixel in the second pixel is spaced apart from the fourth sub-pixel in the first pixel by the preset distance. The second sub-pixel in the third pixel is spaced apart from the fourth sub-pixel in the first pixel by the preset distance.

According to an embodiment of the present disclosure, the first opening further corresponds to a region between the fourth sub-pixel of the first pixel and the first sub-pixel of the second pixel. The second opening further corresponds to a region between the fourth sub-pixel of the first pixel and the second sub-pixel of the third pixel. The third opening further corresponds to a region between the third sub-pixel and the fourth sub-pixel of the first pixel.

According to an embodiment of the present disclosure, the first sub-pixel is a red sub-pixel, the second sub-pixel is a green sub-pixel, the third sub-pixel is a blue sub-pixel, and the fourth sub-pixel is a white sub-pixel.

A second aspect of the present disclosure further provides a system for fabricating a display substrate, which includes a circuit forming unit, configured to form a first circuit for driving a first sub-pixel, a second circuit for driving a second sub-pixel, a third circuit for driving a third sub-pixel and a fourth circuit for driving a fourth sub-pixel, a first mask plate, including a plurality of first openings, each of which corresponds to one first sub-pixel and one fourth sub-pixel, and configured to form the first sub-pixel on the first circuit and the fourth circuit, a second mask plate, including a plurality of second openings, each of which corresponds to one second sub-pixel and one fourth sub-pixel, and configured to form the second sub-pixel on the second circuit and the fourth circuit, and a third mask plate, including a plurality of third openings, each of which corresponds to one third sub-pixel and one fourth sub-pixel, and configured to form the third sub-pixel on the third circuit and the fourth circuit. The first sub-pixel, the second sub-pixel and the third sub-pixel on the fourth circuit are superposed to form the fourth sub-pixel.

According to an embodiment of the present disclosure, each pixel in the display substrate to be formed includes the first sub-pixel, the second sub-pixel, the third sub-pixel and the fourth sub-pixel arranged in a first direction. The fourth sub-pixel corresponding to the first opening belongs to a first pixel, the first sub-pixel corresponding to the first opening belongs to a second pixel adjacent to the first pixel and at a side of the first pixel in the first direction. The fourth sub-pixel corresponding to the second opening belongs to the first pixel, the second sub-pixel corresponding to the second opening belongs to a third pixel adjacent to the first pixel and at a side of the first pixel in a second direction perpendicular to the first direction. The third sub-pixel and the fourth sub-pixel corresponding to the third opening belong to the first pixel.

According to an embodiment of the present disclosure, the plurality of second openings are arranged in the second direction, the fourth sub-pixel corresponding to a first second opening of two adjacent second openings is arranged at a side of the second sub-pixel corresponding to the first second opening in the second direction, and the fourth sub-pixel corresponding to a second second opening of the two adjacent second openings is arranged at another side of the second sub-pixel corresponding to the first second opening in the second direction.

According to an embodiment of the present disclosure, the first sub-pixel, the second sub-pixel, the third sub-pixel and the fourth sub-pixel are in a rectangular shape, and the first opening, the second opening and the third opening are in a rectangular shape.

According to an embodiment of the present disclosure, the adjacent sub-pixels in the first pixel are spaced apart by a preset distance. The first sub-pixel in the second pixel is spaced apart from the fourth sub-pixel in the first pixel by the preset distance. The second sub-pixel in the third pixel is spaced apart from the fourth sub-pixel in the first pixel by the preset distance.

According to an embodiment of the present disclosure, the first opening further corresponds to a region between the fourth sub-pixel of the first pixel and the first sub-pixel of the second pixel. The second opening further corresponds to a region between the fourth sub-pixel of the first pixel and the second sub-pixel of the third pixel. The third opening further corresponds to a region between the third sub-pixel and the fourth sub-pixel of the first pixel.

A third aspect of the present disclosure further provides a display substrate including a plurality of pixels, each of which includes a first sub-pixel, a second sub-pixel, a third sub-pixel and a fourth sub-pixel arranged in a first direction. The fourth sub-pixel in a first pixel is adjacent to the first sub-pixel in a second pixel, and the second pixel is adjacent to the first pixel and at a side of the first pixel in the first direction. The fourth sub-pixel in the first pixel is adjacent to the second sub-pixel in a third pixel, and the third pixel is adjacent to the first pixel and at a side of the first pixel in a second direction perpendicular to the first direction. The fourth sub-pixel in the first pixel is adjacent to the third sub-pixel in the first pixel.

According to an embodiment of the present disclosure, the first sub-pixel, the second sub-pixel, the third sub-pixel and the fourth sub-pixel are in a rectangular shape.

According to an embodiment of the present disclosure, the adjacent sub-pixels in the first pixel are spaced apart by a preset distance. The first sub-pixel in the second pixel is spaced apart from the fourth sub-pixel in the first pixel by the preset distance. The second sub-pixel in the third pixel is spaced apart from the fourth sub-pixel in the first pixel by the preset distance.

A fourth aspect of the present disclosure further provides a display device, which includes the aforementioned display substrate.

According to the aforementioned technical solutions, compared with the prior art, each opening of a mask plate corresponds to two sub-pixel regions and has a larger opening area. Deformation of the opening due to an external force or a magnetic field can be reduced, thereby improving precision of sub-pixels formed and manufacturing yield.

BRIEF DESCRIPTION OF THE DRAWINGS

In order to describe the technical solutions of embodiments of the present disclosure more clearly, the accompanying drawings for describing the embodiments of the present disclosure will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Technical solutions in embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those of ordinary skills in the art based on the embodiments of the present disclosure without creative efforts shall fall within the protection scope of the present disclosure.

Figure 1:
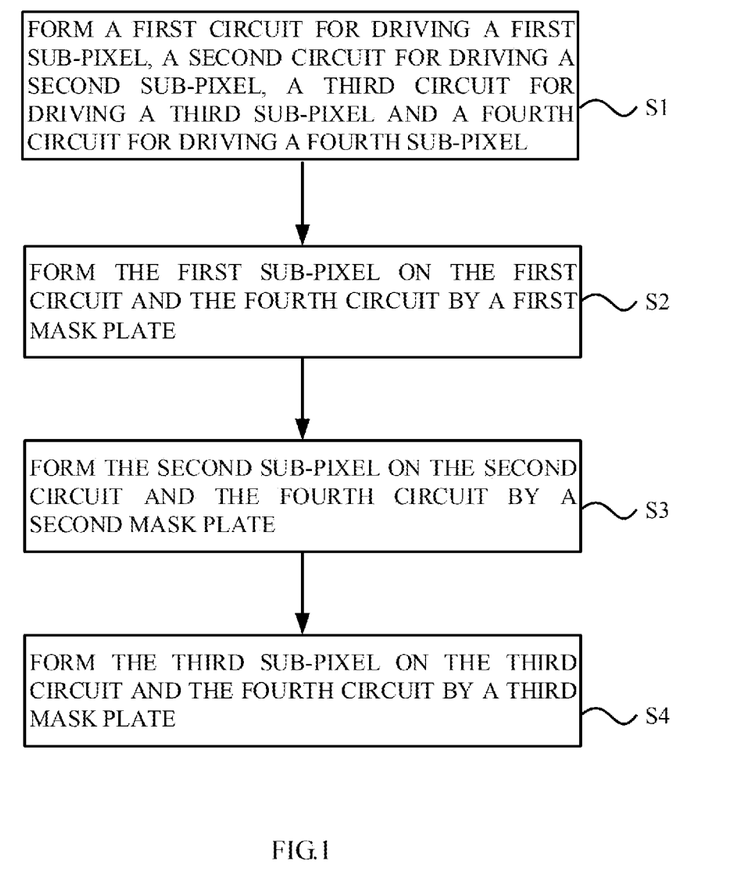
FIG. 1 illustrates a schematic flowchart of a method for fabricating a display substrate according to an embodiment of the present disclosure.

As shown in FIG. 1, a method for fabricating a display substrate according to an embodiment of the present disclosure includes the following steps.

At S1, a first circuit for driving a first sub-pixel, a second circuit for driving a second sub-pixel, a third circuit for driving a third sub-pixel, and a fourth circuit for driving a fourth sub-pixel are formed.

Figure 2:
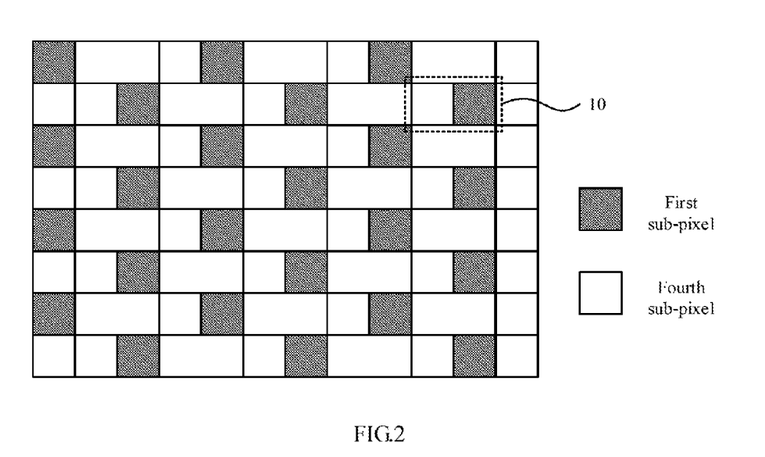
FIG. 2 illustrates a schematic structural diagram of a first mask plate according to an embodiment of the present disclosure.

At S2, the first sub-pixel is formed on the first circuit and the fourth circuit by a first mask plate (as shown in FIG. 2). The first mask plate includes a plurality of first openings 10, each of which corresponds to one first sub-pixel and one fourth sub-pixel.

Figure 3:
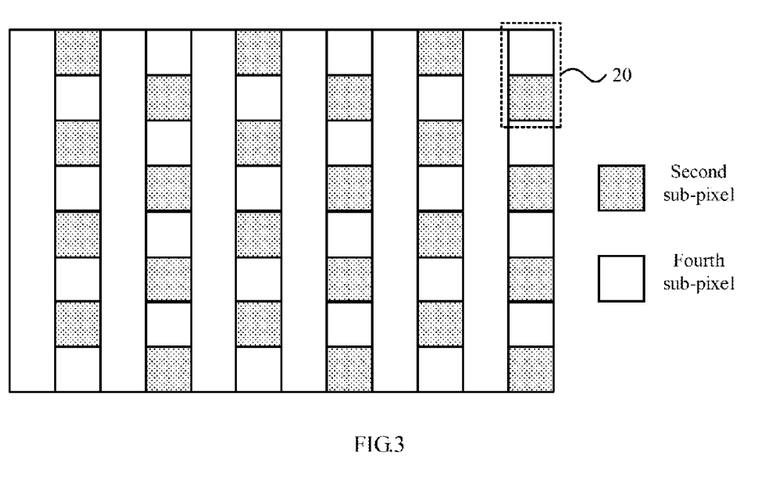
FIG. 3 illustrates a schematic structural diagram of a second mask plate according to an embodiment of the present disclosure.

At S3, the second sub-pixel is formed on the second circuit and the fourth circuit by a second mask plate (as shown in FIG. 3). The second mask plate includes a plurality of second openings 20, each of which corresponds to one second sub-pixel and one fourth sub-pixel.

Figure 4:
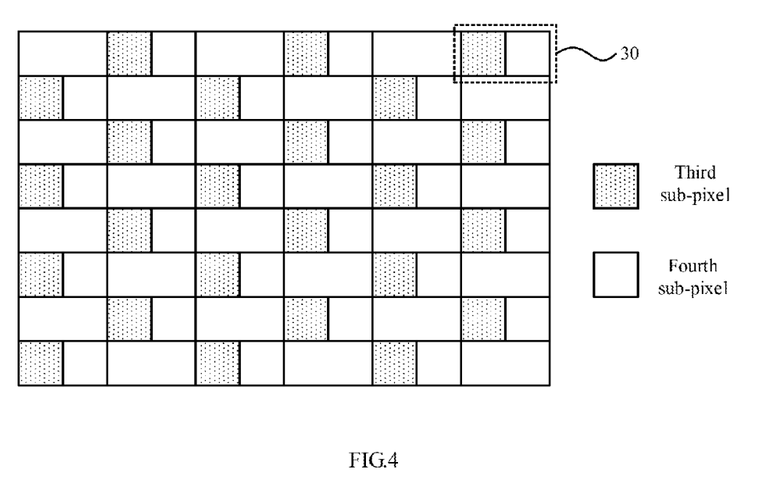
FIG. 4 illustrates a schematic structural diagram of a third mask plate according to an embodiment of the present disclosure.

At S4, the third sub-pixel is formed on the third circuit and the fourth circuit by a third mask plate (as shown in FIG. 4). The third mask plate includes a plurality of third openings 30, each of which corresponds to one third sub-pixel and one fourth sub-pixel.

The first sub-pixel, the second sub-pixel, and the third sub-pixel on the fourth circuit are superposed to form the fourth sub-pixel.

The fourth sub-pixel in the opening of the mask plate as shown in the figures refers to a corresponding position of the fourth sub-pixel rather than the fourth sub-pixel directly formed by a certain mask plate. An independent sub-pixel on the edge of the mask plate as shown in the figures may be a part of the region corresponding to the opening, or may be a separately-arranged opening region.

In this embodiment, the first sub-pixel, the second sub-pixel, and the third sub-pixel are respectively formed by three-time mask process. Simultaneously, the first sub-pixel, the second sub-pixel, and the third sub-pixel are formed on the fourth circuit respectively. Finally the fourth sub-pixel is obtained by superposing the first sub-pixel, the second sub-pixel, and the third sub-pixel on the fourth circuit.

Compared with the prior art in which an opening of a mask plate corresponds to a sub-pixel region, each opening of the mask plate corresponds to two sub-pixel regions and has a larger opening area. Deformation of the opening due to an external force or a magnetic field can be reduced, thereby improving precision of sub-pixels formed and manufacturing yield.

According to an embodiment of the present disclosure, each pixel in the display substrate to be formed includes the first sub-pixel, the second sub-pixel, the third sub-pixel, and the fourth sub-pixel arranged in a first direction (for example, a transverse direction).

The fourth sub-pixel corresponding to the first opening 10 (i.e., a sub-pixel at the left side of the first opening 10) belongs to a first pixel, and the first sub-pixel corresponding to the first opening 10 (i.e., a sub-pixel at the right side of the first opening 10) belongs to a second pixel adjacent to the first pixel and at a side of the first pixel in the first direction (for example, the transverse direction).

The fourth sub-pixel corresponding to the second opening 20 (i.e., a sub-pixel at the upper side of the second opening 20) belongs to the first pixel, and the second sub-pixel corresponding to the second opening 20 (i.e., a sub-pixel at the lower side of the second opening 20) belongs to a third pixel adjacent to the first pixel and at a side of the first pixel in a second direction (for example, a longitudinal direction) perpendicular to the first direction.

The third sub-pixel corresponding to the third opening 30 (i.e., a sub-pixel at the left side of the third opening 30) and the fourth sub-pixel corresponding to the third opening 30 (i.e., a sub-pixel at the right side of the third opening 30) belong to the first pixel.

Figure 5:
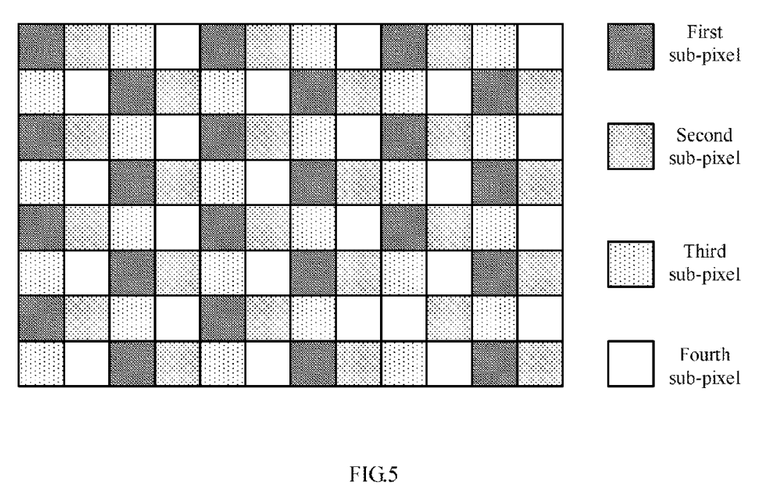
FIG. 5 is a schematic diagram illustrating arrangement of sub-pixels of a display substrate according to an embodiment of the present disclosure.

The first direction in this embodiment may be the transverse direction or the longitudinal direction, and correspondingly the second direction is the longitudinal direction or the transverse direction. The following embodiments are described by taking an example in which the first direction refers to the transverse direction and the second direction refers to the longitudinal direction. The display substrate formed by the three mask plates in this embodiment is as shown in FIG. 5.

Figure 6:
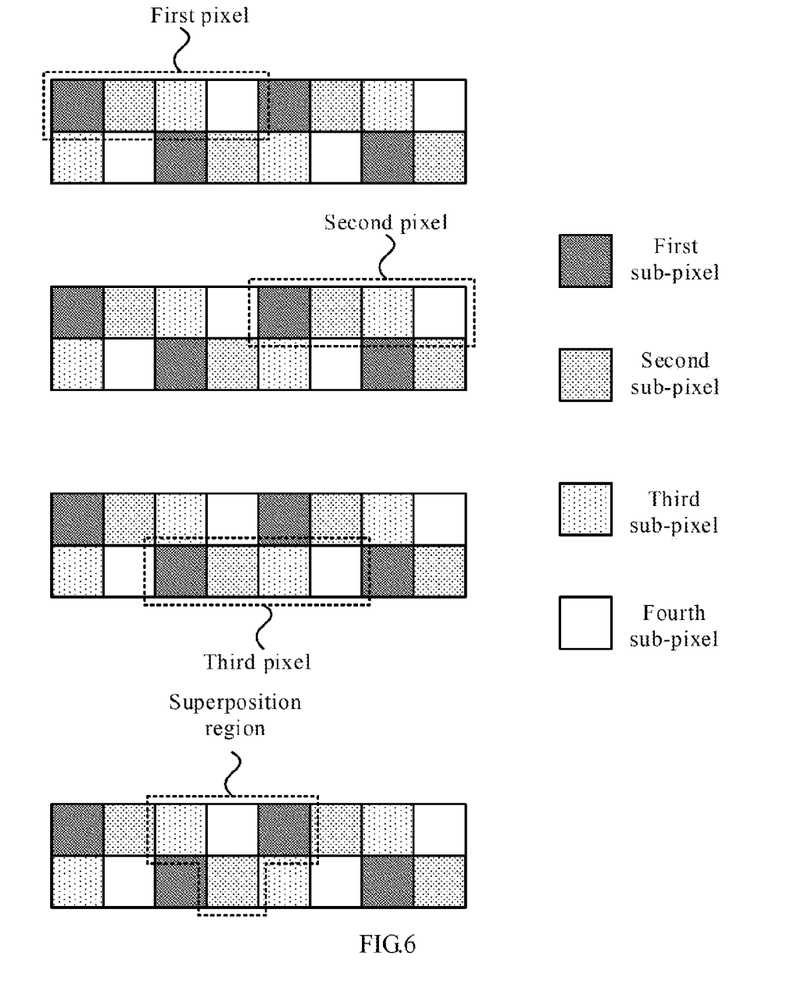
FIG. 6 illustrates a schematic diagram of forming fourth sub-pixels by superposition according to an embodiment of the present disclosure.

As shown in FIG. 6, for the fourth sub-pixel in the first pixel, the corresponding component of its color is formed respectively in a superposition region via the first opening 10, the second opening 20, and the third opening 30. In this process, when forming the first sub-pixel color of the fourth sub-pixel, the first sub-pixel of the pixel at the right side of and in the same row as the first pixel (i.e., the second pixel) may be simultaneously formed. When forming the second sub-pixel color of the fourth sub-pixel, the second sub-pixel of the pixel in the previous or next row of the first pixel (i.e., the third pixel) may be simultaneously formed. When forming the third sub-pixel color of the fourth sub-pixel, the third sub-pixel in the first pixel may be formed simultaneously. In this way, the sub-pixels of each pixel in the display substrate may be formed completely.

According to an embodiment of the present disclosure, the plurality of second openings 20 are arranged in the second direction, the fourth sub-pixel corresponding to a first second opening 20 of two adjacent second openings 20 is arranged at a side of the second sub-pixel in the second direction, and the fourth sub-pixel corresponding to a second second opening 20 of two adjacent second openings 20 is arranged at another side of the second sub-pixel corresponding to the first second opening 20 in the second direction.

According to the aforementioned embodiments, the adjacent pixels in the adjacent rows may be arranged in a staggered way. For example, the first pixel and the third pixel in FIG. 6 stagger the distance of two sub-pixels, so that it is ensured that the second sub-pixel serving as a part of the fourth sub-pixel may be formed on the fourth circuit of each pixel via the second opening 20, and thus match the first opening 10 and the third opening 30 well.

According to an embodiment of the present disclosure, the first sub-pixel, the second sub-pixel, the third sub-pixel, and the fourth sub-pixel are in a rectangular shape, and the first opening 10, the second opening 20, and the third opening 30 are in a rectangular shape.

According to an embodiment of the present disclosure, it can be ensured that the first sub-pixel of the second pixel is arranged exactly on the right of the fourth sub-pixel of the first pixel, the second sub-pixel of the third pixel is arranged exactly below or above the fourth sub-pixel of the first pixel, and the third sub-pixel of the first pixel is arranged exactly on the left of the fourth sub-pixel of the first pixel. In this way, a regularly arranged pixel region is formed.

Figure 7:
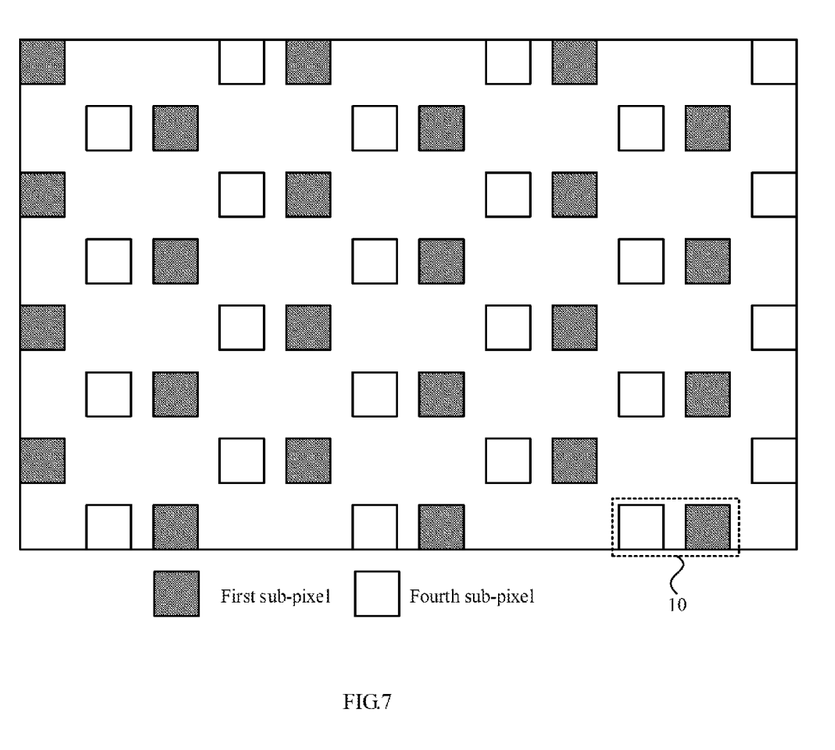
FIG. 7 illustrates a schematic structural diagram of the first mask plate according to another embodiment of the present disclosure.
Figure 8:
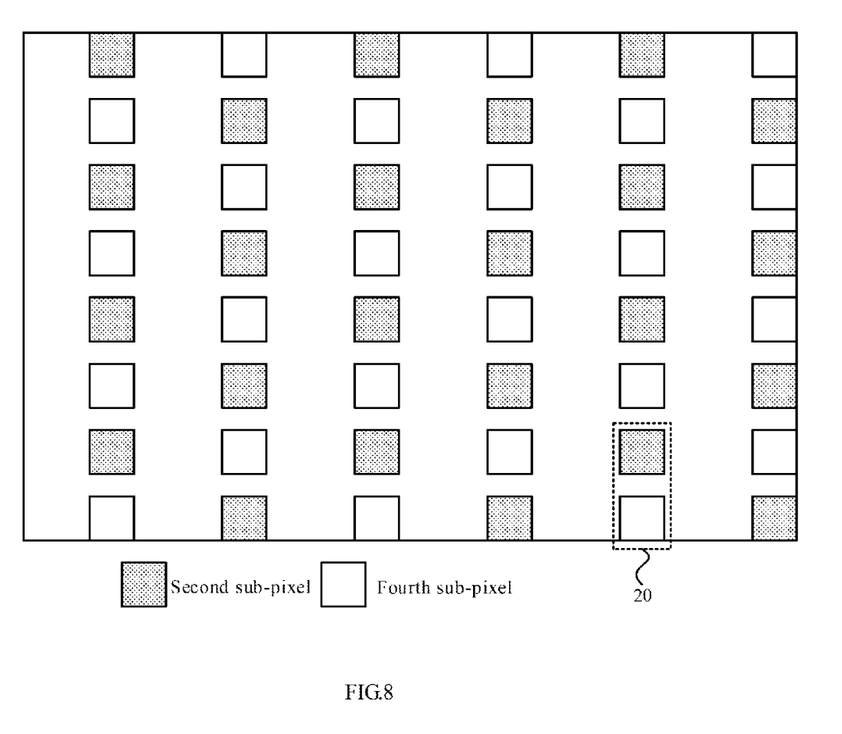
FIG. 8 illustrates a schematic structural diagram of the second mask plate according to another embodiment of the present disclosure.
Figure 9:
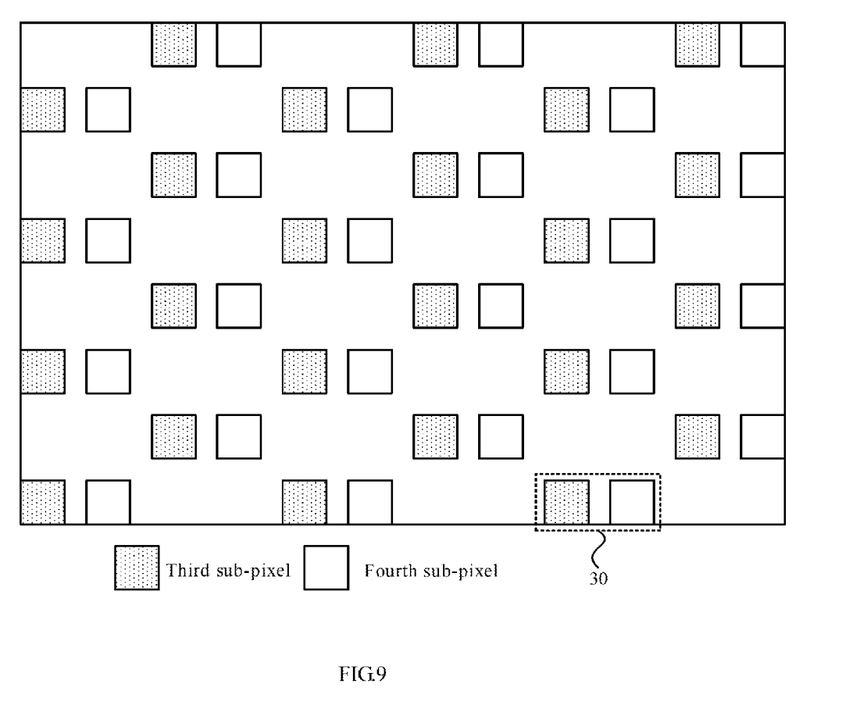
FIG. 9 illustrates a schematic structural diagram of the third mask plate according to another embodiment of the present disclosure.

According to an embodiment of the present disclosure, the adjacent sub-pixels in the first pixel are spaced apart by a preset distance. The first sub-pixel in the second pixel is spaced apart from the fourth sub-pixel in the first pixel by the preset distance. The second sub-pixel in the third pixel is spaced apart from the fourth sub-pixel in the first pixel by the preset distance. Here, the first opening 10 further corresponds to a region between the fourth sub-pixel of the first pixel and the first sub-pixel of the second pixel. A corresponding first mask plate is as shown in FIG. 7. The second opening 20 further corresponds to a region between the fourth sub-pixel of the first pixel and the second sub-pixel of the third pixel. A corresponding second mask plate is as shown in FIG. 8. The third opening 30 further corresponds to a region between the third sub-pixel and the fourth sub-pixel of the first pixel. A corresponding third mask plate is as shown in FIG. 9.

Figure 10:
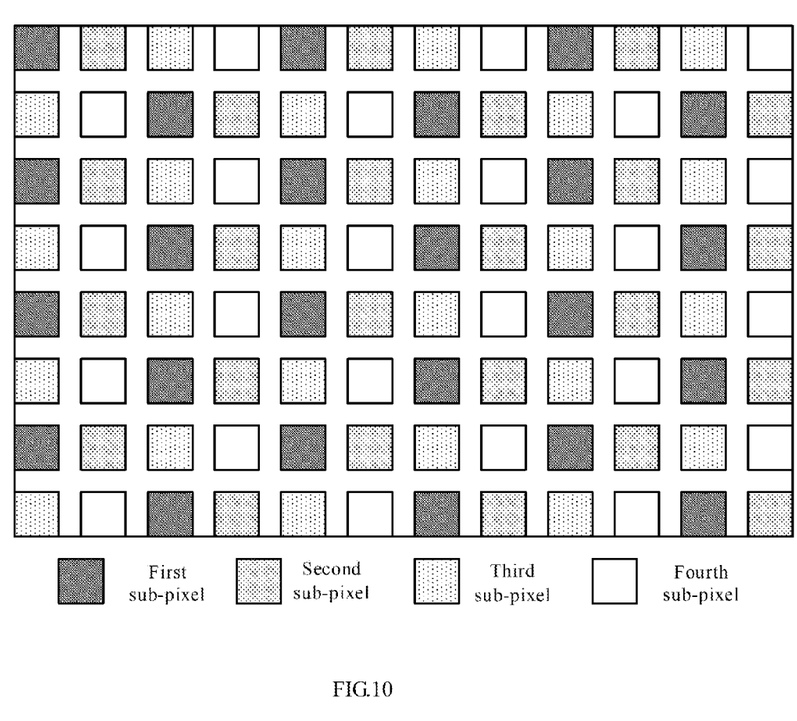
FIG. 10 is a schematic diagram illustrating arrangement of sub-pixels of a display substrate according to another embodiment of the present disclosure.

By arranging the adjacent sub-pixels to be spaced apart by the preset distance, it may be possible that the first opening 10 corresponds to not only the first sub-pixel and the fourth sub-pixel but also the region between the first sub-pixel and the fourth sub-pixel, the second opening 20 corresponds to not only the second sub-pixel and the fourth sub-pixel but also the region between the second sub-pixel and the fourth sub-pixel, and the third opening 30 corresponds to not only the third sub-pixel and the fourth sub-pixel but also the region between the third sub-pixel and the fourth sub-pixel. In this way, the opening area of the mask plate may be further increased, and the precision of sub-pixels formed may be further improved. The display substrate formed by the three mask plates in this embodiment is as shown in FIG. 10.

According to an embodiment of the present disclosure, the first sub-pixel is a red sub-pixel, the second sub-pixel is a green sub-pixel, the third sub-pixel is a blue sub-pixel, and the fourth sub-pixel is a white sub-pixel. A pixel structure having the white sub-pixel may be formed by mixing the red sub-pixel, the green sub-pixel, and the blue sub-pixel. Illumination brightness may be improved because the white sub-pixel has higher transmittance of light. It should be noted that the correspondence between the first sub-pixel, the second sub-pixel, and the third sub-pixel and the red sub-pixel, the green sub-pixel, and the blue sub-pixel are not limited thereto.

Forming processes used in the above flows may include, for example, film forming processes such as depositing and sputtering, and patterning processes such as etching, etc.

An embodiment of the present disclosure further provides a system for fabricating a display substrate, which includes the circuit forming unit, configured to form the first circuit for driving the first sub-pixel, the second circuit for driving the second sub-pixel, the third circuit for driving the third sub-pixel and the fourth circuit for driving the fourth sub-pixel, the first mask plate, including a plurality of first openings, each of which corresponds to one first sub-pixel and one fourth sub-pixel, and configured to form the first sub-pixel on the first circuit and the fourth circuit, the second mask plate, including a plurality of second openings, each of which corresponds to one second sub-pixel and one fourth sub-pixel, and configured to form the second sub-pixel on the second circuit and the fourth circuit, and the third mask plate, including a plurality of third openings, each of which corresponds to one third sub-pixel and one fourth sub-pixel, and configured to form the third sub-pixel on the third circuit and the fourth circuit.

The first sub-pixel, the second sub-pixel, and the third sub-pixel on the fourth circuit are superposed to form the fourth sub-pixel.

According to an embodiment of the present disclosure, each pixel in the display substrate to be formed includes the first sub-pixel, the second sub-pixel, the third sub-pixel, and the fourth sub-pixel arranged in this order in the first direction. The fourth sub-pixel corresponding to the first opening belongs to the first pixel, and the first sub-pixel corresponding to the first opening belongs to the second pixel adjacent to the first pixel and at a side of the first pixel in the first direction. The fourth sub-pixel corresponding to the second opening belongs to the first pixel, and the second sub-pixel corresponding to the second opening belongs to the third pixel adjacent to the first pixel and at a side of the first pixel in the second direction perpendicular to the first direction. The third sub-pixel and the fourth sub-pixel corresponding to the third opening belong to the first pixel.

According to an embodiment of the present disclosure, the plurality of second openings are arranged in the second direction, the fourth sub-pixel corresponding to a first second opening of two adjacent second openings is arranged at a side of the second sub-pixel in the second direction, and the fourth sub-pixel corresponding to a second second opening is arranged at another side of the second sub-pixel corresponding to the first second opening in the second direction.

According to an embodiment of the present disclosure, the first sub-pixel, the second sub-pixel, the third sub-pixel, and the fourth sub-pixel are in a rectangular shape, and the first opening, the second opening, and the third opening are in a rectangular shape.

According to an embodiment of the present disclosure, the adjacent sub-pixels in the first pixel are spaced apart by the preset distance. For example, the third sub-pixel and the fourth sub-pixel in the first pixel are spaced apart by the preset distance. The adjacent sub-pixels in the adjacent pixels are spaced apart by the preset distance. For example, the first sub-pixel in the second pixel is spaced apart from the fourth sub-pixel in the first pixel by the preset distance. The second sub-pixel in the third pixel is spaced apart from the fourth sub-pixel in the first pixel by the preset distance. In this case, the first opening further corresponds to the region between the fourth sub-pixel of the first pixel and the first sub-pixel of the second pixel. The second opening further corresponds to the region between the fourth sub-pixel of the first pixel and the second sub-pixel of the third pixel. The third opening further corresponds to the region between the third sub-pixel and the fourth sub-pixel of the first pixel.

An embodiment of the present disclosure further provides a display substrate including a plurality of pixels, each of which includes the first sub-pixel, the second sub-pixel, the third sub-pixel, and the fourth sub-pixel arranged in the first direction. The fourth sub-pixel in the first pixel is adjacent to the first sub-pixel in the second pixel, and the second pixel is adjacent to the first pixel and at a side of the first pixel in the first direction. The fourth sub-pixel in the first pixel is adjacent to the second sub-pixel in the third pixel and the third pixel is adjacent to the first pixel and at a side of the first pixel in a second direction perpendicular to the first direction. The fourth sub-pixel in the first pixel is adjacent to the third sub-pixel in the first pixel.

According to an embodiment of the present disclosure, the first sub-pixel, the second sub-pixel, the third sub-pixel, and the fourth sub-pixel are in a rectangular shape.

According to an embodiment of the present disclosure, adjacent sub-pixels in the first pixel are spaced apart by the preset distance, the first sub-pixel in the second pixel is spaced apart from the fourth sub-pixel in the first pixel by the preset distance, and the second sub-pixel in the third pixel is spaced apart from the fourth sub-pixel in the first pixel by the preset distance.

An embodiment of the present disclosure further provides a display device, which includes the display substrate according to any one of the aforementioned embodiments.

It is to be noted that the display device in this embodiment may be any product or component having a display function, such as an electronic paper display, a mobile phone, a tablet computer, a TV set, a notebook computer, a digital photo frame, a navigation device and so on.

In the present disclosure, terms "first", "second", "third" and "fourth" are merely for description purposes, rather than being understood as indicating or implying relative importance. The term "a plurality of" refers to two or more than two, unless otherwise clearly defined.

The abovementioned embodiments are merely the example embodiments of the present disclosure, but the scope of protection of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. A method for fabricating a display substrate comprising:
   forming a first circuit for driving a first sub-pixel, a second circuit for driving a second sub-pixel, a third circuit for driving a third sub-pixel, and a fourth circuit for driving a fourth sub-pixel;
   forming the first sub-pixel on the first circuit and the fourth circuit using a first mask plate, wherein the first mask plate includes a plurality of first openings, each first opening corresponding to one first sub-pixel and one fourth sub-pixel;
   forming the second sub-pixel on the second circuit and the fourth circuit using a second mask plate, wherein the second mask plate includes a plurality of second openings, each second opening corresponding to one second sub-pixel and one fourth sub-pixel; and
   forming the third sub-pixel on the third circuit and the fourth circuit using a third mask plate, wherein the third mask plate includes a plurality of third openings, each third opening corresponding to one third sub-pixel and one fourth sub-pixel, wherein the first sub-pixel, the second sub-pixel, and the third sub-pixel on the fourth circuit are superposed to form the fourth sub-pixel.

2. The method for fabricating a display substrate according to claim 1, wherein each pixel in the display substrate to be formed includes the first sub-pixel, the second sub-pixel, the third sub-pixel, and the fourth sub-pixel arranged in a first direction;
   wherein the fourth sub-pixel corresponding to the first opening belongs to a first pixel, and the first sub-pixel corresponding to the first opening belongs to a second pixel adjacent to the first pixel and at a side of the first pixel in the first direction;
   wherein the fourth sub-pixel corresponding to the second opening belongs to the first pixel, and the second sub-pixel corresponding to the second opening belongs to a third pixel adjacent to the first pixel and at a side of the first pixel in a second direction perpendicular to the first direction; and
   wherein the third sub-pixel and the fourth sub-pixel corresponding to the third opening belong to the first pixel.

3. The method for fabricating a display substrate according to claim 2, wherein the plurality of second openings are arranged in the second direction, wherein the fourth sub-pixel corresponding to a first second opening of two adjacent second openings is arranged at a side of the second sub-pixel corresponding to the first second opening in the second direction, and wherein the fourth sub-pixel corresponding to a second second opening of the two adjacent second openings is arranged at another side of the second sub-pixel corresponding to the first second opening along the second direction.

4. The method for fabricating a display substrate according to claim 3, wherein the first sub-pixel, the second sub-pixel, the third sub-pixel, and the fourth sub-pixel have a rectangular shape, and wherein the first opening, the second opening, and the third opening have a rectangular shape.

5. The method for fabricating a display substrate according to claim 4, wherein the adjacent sub-pixels in the first pixel are spaced apart by a preset distance, wherein the first sub-pixel in the second pixel is spaced apart from the fourth sub-pixel in the first pixel by the preset distance, and wherein the second sub-pixel in the third pixel is spaced apart from the fourth sub-pixel in the first pixel by the preset distance.

6. The method for fabricating a display substrate according to claim 3, wherein adjacent sub-pixels in the first pixel are spaced apart by a preset distance, wherein the first sub-pixel in the second pixel is spaced apart from the fourth sub-pixel in the first pixel by the preset distance, and wherein the second sub-pixel in the third pixel is spaced apart from the fourth sub-pixel in the first pixel by the preset distance.

7. The method for fabricating a display substrate according to claim 6, wherein the first opening further corresponds to a region between the fourth sub-pixel of the first pixel and the first sub-pixel of the second pixel;
   wherein the second opening further corresponds to a region between the fourth sub-pixel of the first pixel and the second sub-pixel of the third pixel; and
   wherein the third opening further corresponds to a region between the third sub-pixel and the fourth sub-pixel of the first pixel.

8. The method for fabricating a display substrate according to claim 2, wherein adjacent sub-pixels in the first pixel are spaced apart by a preset distance, wherein the first sub-pixel in the second pixel is spaced apart from the fourth sub-pixel in the first pixel by the preset distance, and wherein the second sub-pixel in the third pixel is spaced apart from the fourth sub-pixel in the first pixel by the preset distance.

9. The method for fabricating a display substrate according to claim 8, wherein the first opening further corresponds to a region between the fourth sub-pixel of the first pixel and the first sub-pixel of the second pixel;
   wherein the second opening further corresponds to a region between the fourth sub-pixel of the first pixel and the second sub-pixel of the third pixel; and
   wherein the third opening further corresponds to a region between the third sub-pixel and the fourth sub-pixel of the first pixel.

10. The method for fabricating a display substrate according to claim 1, wherein the first sub-pixel is a red sub-pixel, the second sub-pixel is a green sub-pixel, the third sub-pixel is a blue sub-pixel, and the fourth sub-pixel is a white sub-pixel.

11. A system for fabricating a display substrate comprising:
    a circuit forming unit configured to form a first circuit for driving a first sub-pixel, a second circuit for driving a second sub-pixel, a third circuit for driving a third sub-pixel, and a fourth circuit for driving a fourth sub-pixel;
    a first mask plate comprising a plurality of first openings, each first opening corresponding to one first sub-pixel and one fourth sub-pixel, the first mask plate configured to form the first sub-pixel on the first circuit and the fourth circuit;

a second mask plate comprising a plurality of second openings, each second opening corresponding to one second sub-pixel and one fourth sub-pixel, the second mask plate configured to form the second sub-pixel on the second circuit and the fourth circuit; and a third mask plate, comprising a plurality of third openings, each third opening corresponding to one third sub-pixel and one fourth sub-pixel, the third mask plate configured to form the third sub-pixel on the third circuit and the fourth circuit, wherein the first sub-pixel, the second sub-pixel, and the third sub-pixel on the fourth circuit are superposed to form the fourth sub-pixel.

12. The system for fabricating a display substrate according to claim 11, wherein each pixel in the display substrate to be formed comprises the first sub-pixel, the second sub-pixel, the third sub-pixel, and the fourth sub-pixel arranged in a first direction;

wherein the fourth sub-pixel corresponding to the first opening belongs to a first pixel, and the first sub-pixel corresponding to the first opening belongs to a second pixel adjacent to the first pixel and at a side of the first pixel in the first direction;

wherein the fourth sub-pixel corresponding to the second opening belongs to the first pixel, and the second sub-pixel corresponding to the second opening belongs to a third pixel adjacent to the first pixel and at a side of the first pixel in a second direction perpendicular to the first direction; and wherein the third sub-pixel and the fourth sub-pixel corresponding to the third opening belong to the first pixel.

13. The system for fabricating a display substrate according to claim 12, wherein the plurality of second openings are arranged in the second direction, wherein the fourth sub-pixel corresponding to a first second opening of two adjacent second openings is arranged at a side of the second sub-pixel corresponding to the first second opening in the second direction, and wherein the fourth sub-pixel corresponding to a second second opening of the two adjacent second openings is arranged at another side of the second sub-pixel corresponding to the first second opening along the second direction.

14. The system for fabricating a display substrate according to claim 13, wherein the first sub-pixel, the second sub-pixel, the third sub-pixel, and the fourth sub-pixel have a rectangular shape, and wherein the first opening, the second opening, and the third opening have a rectangular shape.

15. The system for fabricating a display substrate according to claim 12, wherein adjacent sub-pixels in the first pixel are spaced apart by a preset distance;

wherein the first sub-pixel in the second pixel is spaced apart from the fourth sub-pixel in the first pixel by the preset distance; and wherein the second sub-pixel in the third pixel is spaced apart from the fourth sub-pixel in the first pixel by the preset distance.

16. The system for fabricating a display substrate according to claim 15, wherein the first opening further corresponds to a region between the fourth sub-pixel of the first pixel and the first sub-pixel of the second pixel;

wherein the second opening further corresponds to a region between the fourth sub-pixel of the first pixel and the second sub-pixel of the third pixel; and wherein the third opening further corresponds to a region between the third sub-pixel and the fourth sub-pixel of the first pixel.

* * * * *